United States Patent
Oshige

(10) Patent No.: US 10,388,592 B2
(45) Date of Patent: Aug. 20, 2019

(54) SEMICONDUCTOR DEVICE AND MANUFACTURING METHOD THEREOF

(71) Applicant: CANON KABUSHIKI KAISHA, Tokyo (JP)

(72) Inventor: Hidemasa Oshige, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/800,567

(22) Filed: Nov. 1, 2017

(65) Prior Publication Data

US 2018/0151475 A1 May 31, 2018

(30) Foreign Application Priority Data

Nov. 29, 2016 (JP) .................. 2016-231339

(51) Int. Cl.
| | |
|---|---|
| H01L 23/48 | (2006.01) |
| H01L 27/146 | (2006.01) |
| H01L 21/768 | (2006.01) |

(52) U.S. Cl.
CPC ...... *H01L 23/481* (2013.01); *H01L 21/76831* (2013.01); *H01L 21/76832* (2013.01); *H01L 21/76898* (2013.01); *H01L 27/14636* (2013.01); *H01L 27/14687* (2013.01)

(58) Field of Classification Search
CPC .................................. H01L 21/76831
See application file for complete search history.

(56) References Cited

U.S. PATENT DOCUMENTS

| | | | |
|---|---|---|---|
| 9,659,858 B2 * | 5/2017 | Mohammed | ...... H01L 21/76898 |
| 2008/0224249 A1 | 9/2008 | Nabe et al. | |
| 2009/0200679 A1 | 8/2009 | Harada et al. | |
| 2012/0256300 A1 | 10/2012 | Nakamura | |
| 2013/0307155 A1 | 11/2013 | Mitsuhashi | |

(Continued)

FOREIGN PATENT DOCUMENTS

| | | |
|---|---|---|
| JP | 2010-161215 A | 7/2010 |
| JP | 2011-40457 A | 2/2011 |

OTHER PUBLICATIONS

Oshige, U.S. Appl. No. 15/664,057, filed Jul. 31, 2017.
Kazue et al., U.S. Appl. No. 15/711,589, filed Sep. 21, 2017.

*Primary Examiner* — Mounir S Amer
(74) *Attorney, Agent, or Firm* — Venable LLP

(57) ABSTRACT

A semiconductor device includes: a semiconductor substrate having a first surface and a second surface, provided with a through hole which is surrounded by an inner side surface connecting the first surface to the second surface; a semiconductor element arranged on the first surface side; a wiring layer arranged on the first surface side; a through electrode arranged in the through hole, penetrating the semiconductor substrate, and connected to the wiring layer; and an insulating member arranged between the inner side surface and the through electrode, wherein the insulating member includes a first insulating film arranged between the inner side surface and the through electrode, and includes a second insulating film arranged between the first insulating film and the through electrode, and wherein a crack in the insulating member is in the first insulating film, and the crack is located between the second insulating film and the inner side surface.

19 Claims, 5 Drawing Sheets

(56) References Cited

U.S. PATENT DOCUMENTS

2013/0323883 A1* 12/2013 Yu ..................... H01L 21/486
                                                      438/108
2015/0115412 A1    4/2015 Nomura
2016/0268163 A1    9/2016 Nakamura
2017/0287973 A1   10/2017 Oshige et al.
2019/0057996 A1*   2/2019 Oshige ............. H01L 27/14636

* cited by examiner

AFTER FORMING FIRST
INSULATING FILM
(DEPOSITION TEMPERATURE T1)

AFTER FORMING SECOND
INSULATING FILM
(DEPOSITION TEMPERATURE T2)

AFTER FORMING THROUGH
ELECTRODE

AFTER FORMING
FIRST INSULATING FILM
(DEPOSITION TEMPERATURE T1)

AFTER HEAT TREATMENT
(HEAT TREATMENT TEMPERATURE Ta)

AFTER FORMING
SECOND INSULATING FILM
(DEPOSITION TEMPERATURE T2)

AFTER FORMING THROUGH
ELECTRODE

SEMICONDUCTOR DEVICE AND MANUFACTURING METHOD THEREOF

BACKGROUND OF THE INVENTION

Field of the Invention

The present invention relates to a semiconductor device having a through electrode and a manufacturing method of the semiconductor device.

Description of the Related Art

A semiconductor device (semiconductor chip) such as a solid state imaging device has the structure including a semiconductor substrate on which elements such as a transistor are formed, an insulating member arranged on the semiconductor substrate, and wiring portions arranged therein, for example. The wiring portion includes a wiring pattern connecting one element to another, a wiring pattern used for supplying electrical power to an element, and the like. Further, the semiconductor device further includes an electrode portion used for connecting the semiconductor device to an external device (another semiconductor device, a circuit substrate, or the like). A part of the wiring portion may be connected to the electrode portion.

When a semiconductor device is connected to an external device by using a flip-chip connection, for example, an electrode portion called a bump is used. Some electrode portions as discussed above may be formed from a back surface side (the opposite side to the wiring portion of the semiconductor substrate) of the semiconductor substrate to the wiring portion. Since such an electrode portion is formed so as to penetrate the semiconductor substrate (for example, a silicon substrate), the electrode portion may be called "through electrode".

Japanese Patent Application Publication No. 2011-40457 discloses a process of fabricating a Through Silicon Via (TSV) that is a through electrode.

The through electrode described above is formed as follows, for example. That is, first, a via hole is formed by etching a semiconductor substrate from the back surface side thereof and removing a part of the semiconductor substrate and a part of a wiring insulating member to expose a part of the wiring portion (a part to be connected to an external device). Next, an insulating film is formed on the back surface of the semiconductor substrate and the inner surface of the via hole. Next, a through electrode is formed by embedding a conductive member in the via hole.

One of the schemes of forming a vertical via hole so as to penetrate from the back surface side of a semiconductor substrate may be a so-called Bosch process. Basically, the Bosch process is a process of gradual etching in the vertical direction by repeating a cycle of three steps of (1) an isotropic etching step, (2) a protection film deposition step, and (3) a protection film removal step at the via bottom. As a structural feature of the inner wall of a through hole formed by the Bosch process, a concave-convex shape called a scallop occurs. As this scallop is covered with an insulating film, there is a problem of a crack (break) occurring inside the insulating film starting from a convex portion of the scallop. Such a crack may cause a reduction in the dielectric voltage of the insulating film.

Japanese Patent Application Publication No. 2011-40457 discloses that a silicon oxide film is formed by using a microwave excitation plasma Chemical Vapor Deposition (CVD) method in order to obtain an insulating film having a good film quality as an insulating film formed on the inner wall of a hole formed in the semiconductor substrate. Further, Japanese Patent Application Publication No. 2011-40457 discloses that a multilayered insulating film comprising silicon oxide films and silicon nitride films is formed. Even when a multilayered insulating film is formed, however, if a crack starting from a scallop occurs after the final insulating film is deposited, the crack will be formed continuously inside the multilayered insulating film from the bottom surface on the semiconductor substrate side to the top surface on the through electrode side. As a result, the dielectric voltage of the insulating film decreases, which may lead to a problem of a reduction in the yield rate or a reduction in the long-term reliability due to a short-circuit.

SUMMARY OF THE INVENTION

The present invention intends to provide a reliable semiconductor device with a high yield rate in which an insulation performance of an insulating member between a through electrode and a semiconductor substrate is maintained in the long term and a manufacturing method of such a semiconductor device.

According to one aspect of the present invention, provided is a semiconductor device including: a semiconductor substrate having a first surface and a second surface opposing to each other, the semiconductor substrate being provided with a through hole which is surrounded by an inner side surface connecting the first surface to the second surface; a semiconductor element arranged on the first surface side of the semiconductor substrate; a wiring layer arranged on the first surface side of the semiconductor substrate; a through electrode arranged in the through hole of the semiconductor substrate, penetrating the semiconductor substrate, and connected to the wiring layer; and an insulating member arranged between the inner side surface of the semiconductor substrate and the through electrode, wherein the insulating member includes a first insulating film arranged between the inner side surface of the semiconductor substrate and the through electrode, and includes a second insulating film arranged between the first insulating film and the through electrode, and wherein a crack in the insulating member is in the first insulating film, and the crack is located between the second insulating film and the inner side surface.

According to another aspect of the present invention, provided is a manufacturing method of a semiconductor device, the manufacturing method including steps of: preparing a semiconductor substrate, the semiconductor substrate being provided with a semiconductor element on a first surface side of a semiconductor substrate, and with a wiring layer on the first surface side of the semiconductor substrate via an interlayer insulating layer; forming a through hole reaching the wiring layer in the semiconductor substrate and the interlayer insulating layer by opening the semiconductor substrate and the interlayer insulating layer from a second surface opposing to the first surface of the semiconductor substrate; stacking a first insulating film and a second insulating film in this order on an inner side surface of the through hole; and forming a through electrode comprising a conductive material by embedding the conductive material inside the through hole on which the first insulting film and the second insulating film are stacked, wherein a deposition temperature for the first insulating film is higher than a deposition temperature for the second insulating film.

According to further another aspect of the present invention, provided is a manufacturing method of a semiconductor device, the manufacturing method including steps of: preparing a semiconductor substrate, the semiconductor substrate being provided with a semiconductor element on a first surface side of a semiconductor substrate, and with a wiring layer on the first surface side of the semiconductor substrate via an interlayer insulating layer; forming a through hole reaching the wiring layer in the semiconductor substrate and the interlayer insulating layer by opening the semiconductor substrate and the interlayer insulating layer from a second surface opposing to the first surface of the semiconductor substrate; stacking a first insulating film and a second insulating film in this order on an inner side surface of the through hole; and forming a through electrode comprising a conductive material by embedding the conductive material inside the through hole on which the first insulting film and the second insulating film are stacked, wherein the step of stacking the first insulating film and the second insulating film in this order includes a step of heating the semiconductor substrate after forming the first insulating film and before forming the second insulating film.

According to the present invention, the insulation performance of the insulating member between the through electrode and the semiconductor substrate is maintained in the long term, and a reliable semiconductor device with a high yield rate can be obtained.

Further features of the present invention will become apparent from the following description of exemplary embodiments with reference to the attached drawings.

DESCRIPTION OF THE EMBODIMENTS

Figure 1:
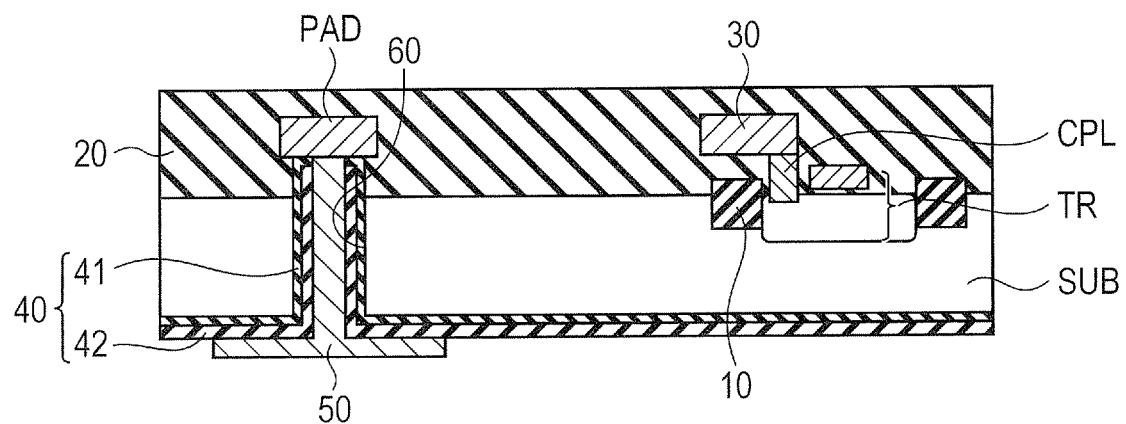
FIG. 1 is a schematic sectional view illustrating the structure of a semiconductor device according to a first embodiment of the present invention.

Preferred embodiments of the present invention will now be described in detail in accordance with the accompanying drawings. In each of the drawings, the same members or the same components are labeled with the same reference numeral, and the duplicated description thereof will be omitted in each of the following embodiments.

First Embodiment

A semiconductor device and a manufacturing method thereof according to a first embodiment of the present invention will be described by using FIG. 1 to FIG. 4C.

First, the general structure of the semiconductor device according to the present embodiment will be described by using FIG. 1. FIG. 1 is a schematic sectional view illustrating the structure of the semiconductor device according to the present embodiment. While not limited in particular, the semiconductor device according to the present embodiment may be a solid state imaging device, for example.

As illustrated in FIG. 1, the semiconductor device according to the present embodiment has a semiconductor substrate SUB, a semiconductor element TR formed on a first surface side, where the first surface is one of the primary surfaces of opposing primary surfaces of the semiconductor substrate SUB, and an element isolation portion 10 formed of an element isolation film. Further, the semiconductor device according to the present embodiment has an interlayer insulating layer (interlayer insulating film) 20, a wiring layer 30, and a contact plug CPL connecting the semiconductor element TR and the wiring layer 30 to each other. Further, the semiconductor device according to the present embodiment has a through electrode 50 formed inside a through hole 60 in the semiconductor substrate SUB and an electrode portion PAD connected to the through electrode 50. Further, the semiconductor device according to the present embodiment has an insulating member 40 for ensuring insulation between the through electrode 50 and the semiconductor substrate SUB.

The semiconductor substrate SUB provided with the through hole 60 is a semiconductor substrate such as a silicon substrate formed of a silicon, for example. The element isolation portion 10 that defines an element region is formed on the first surface of the semiconductor substrate SUB. The semiconductor element TR such as a transistor is arranged in the element region defined on the first surface of the semiconductor substrate SUB by the element isolation portion 10.

The interlayer insulating layer 20 is arranged on the entire first surface of the semiconductor substrate SUB including the semiconductor element TR. The interlayer insulating layer 20 may be formed of an insulating material such as a silicon oxide, a silicon nitride, or the like, for example.

The wiring layer 30 is arranged inside the interlayer insulating layer 20. Note that, while the wiring layer 30 is depicted as a single layer in FIG. 1, the wiring layer 30 may be multiple layers and, in this case, the wiring layers are connected to each other by a via. The wiring layer 30 is formed of a metal such as copper, aluminum, or the like, for example. Further, the electrode portion (electrode pad) PAD that is a part of the wiring layer 30 used for connection to the through electrode 50 is arranged inside the interlayer insulating layer 20. When the wiring layer 30 is formed of multiple layers, the electrode portion PAD can be formed in the same layer and/or of the same material as any one of the layers of the wiring layer 30. The contact plug CPL is formed of a metal such as tungsten, for example, embedded in the contact hole formed in the interlayer insulating layer 20. The contact plug CPL electrically connects the semiconductor element TR and the wiring layer 30 to each other. Further, although not shown, a barrier metal formed of titanium, tantalum, a nitride thereof, or the like may be further used for the wiring layer 30, the electrode portion PAD, and the contact plug CPL so as to prevent the metal thereof from diffusing in the semiconductor substrate SUB. Note that the semiconductor device according to the present embodiment further has a support substrate (not shown) provided on the first surface side of the semiconductor substrate SUB.

The through electrode 50 is a TSV and is formed inside the through hole 60. The through hole 60 is surrounded by an inner side surface connecting the first surface to the second surface of the semiconductor substrate SUB. The through electrode 50 extends from the second surface side, which is the other primary surface of the opposing primary surfaces of the semiconductor substrate SUB, to the electrode portion PAD formed on the first surface side of the semiconductor substrate SUB and is connected to the electrode portion PAD. That is, the through electrode 50 is surrounded by the inner side surface connecting the first surface to the second surface of the semiconductor substrate SUB and is connected to the electrode portion PAD through the semiconductor substrate SUB. The through electrode 50 is formed of a conductive member such as a metal embedded inside the through hole 60. The through hole 60 in which the through electrode 50 is embedded is formed so as to penetrate the semiconductor substrate SUB from the second surface to the first surface and reach the electrode portion PAD in the interlayer insulating layer 20. Copper, aluminum, or the like may be used for a conductive member forming the through electrode 50. A barrier metal formed of titanium, tantalum, a nitride thereof, or the like may be further used for the through electrode 50 so as to prevent the metal from diffusing in the semiconductor substrate SUB.

The insulating member 40 is arranged between the through electrode 50 and the semiconductor substrate SUB. More specifically, the insulating member 40 is formed on the inner side surface of the through hole 60 and the second surface of the semiconductor substrate SUB. The through electrode 50 has a portion embedded in the through hole 60 in which the insulating member 40 is formed on the inner side surface thereof and a portion formed on the insulating member 40 on the second surface of the semiconductor substrate SUB around the through hole 60. The insulation between the through electrode 50 and the semiconductor substrate SUB is ensured by the insulating member 40. The insulating member 40 is formed of a first insulating film 41 arranged between the inner side surface of the through hole 60 and the through electrode 50 and a second insulating film 42 arranged between the first insulating film 41 and the through electrode 50, as described later. Note that the inner side surface of the through hole 60 is a side surface connecting the first surface to the second surface of the semiconductor substrate SUB. An insulating film made of a silicon oxide, a silicon nitride, a silicon oxide nitride, or the like, for example, may be used for each of the first insulating film 41 and the second insulating film 42 of the insulating member 40.

Figure 2A:
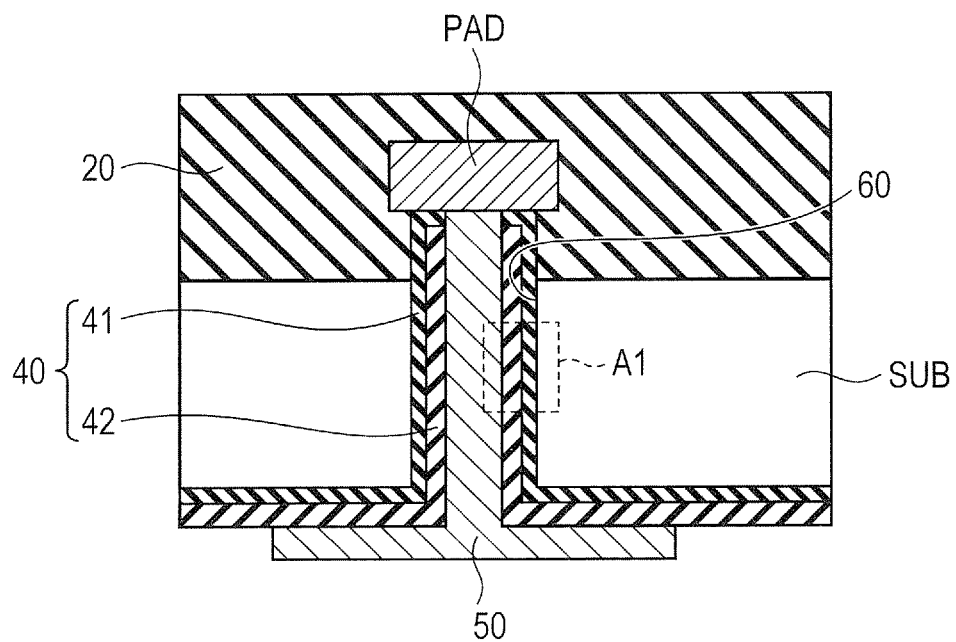
FIGS. 2A and 2B are enlarged schematic sectional views illustrating the structure of a through electrode and an insulating member of the semiconductor device according to the first embodiment of the present invention.
Figure 2B:
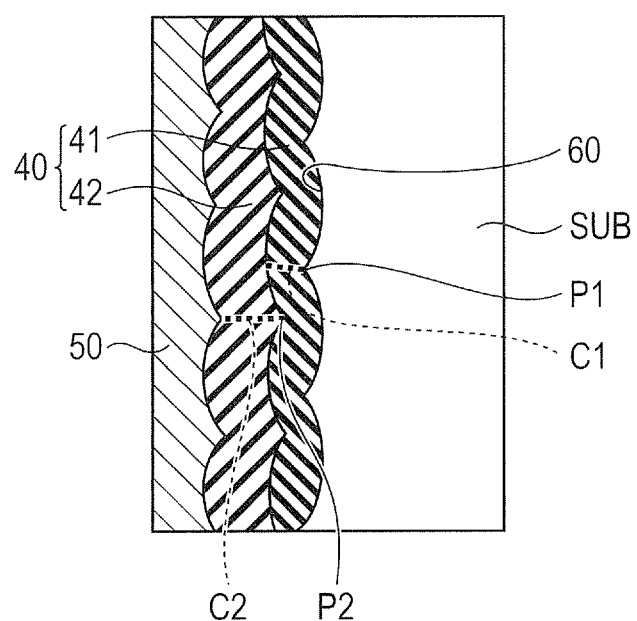

Next, the insulating member 40 that characterizes the semiconductor device according to the present embodiment will be described in detail by using FIG. 2A and FIG. 2B. FIG. 2A is an enlarged schematic sectional view illustrating the structure of the through electrode 50 and the insulating member 40 of the semiconductor device according to the present embodiment. FIG. 2B is an enlarged schematic sectional view illustrating a region A1 surrounded by a dashed line in FIG. 2A.

As illustrated in FIG. 2A, in the semiconductor device according to the present embodiment, the insulating member 40 is formed of the first insulating film 41 and the second insulating film 42 stacked in this order from the semiconductor substrate SUB side. The first insulating film 41 and the second insulating film 42 are stacked in this order from the semiconductor substrate SUB side on the inner side surface of the through hole 60 and the second surface of the semiconductor substrate SUB. In this way, the insulating member 40 includes the first insulating film 41 arranged between the inner side surface of the through hole 60, which is a side wall connecting the first surface and the second surface of the semiconductor substrate SUB, and the through electrode 50 and the second insulating film 42 arranged between the first insulating film 41 and the through electrode 50. Note that, although the case where the insulating film has two layers is described here, the insulating member 40 may be formed of stacked three or more layers of insulating films. The through electrode 50 is embedded in the through hole 60 in which the insulating member 40 including the multilayered insulating film is formed on the inner side surface as described above.

Typically, in order to form the through electrode 50, first, the through hole 60 is formed in the semiconductor substrate SUB by etching. Etching of the through hole 60 is typically performed by a method of a so-called Bosch process. The Bosch process is a scheme of vertical etching by switching, at high speed, (1) an isotropic etching step, (2) a protection film deposition step, and (3) a protection film removal step as one cycle in short time for each step and repeating this cycle. In the isotropic etching step, a gas such as $SF_6$ is used, and etching proceeds mainly with a radical as reactive species. Since a long duration of this step may increase side etching, this step is switched to the protection film deposition step in a short time (around several seconds). In the protection film deposition step, a CF copolymer film is deposited as a protection film on the inner side surface and the inner bottom surface of the via hole by decomposing a gas such as $C_4F_8$ in a plasma. This step is also switched to the next step in a short time such as around several seconds. In the protection film removal step, only the protection film on the inner bottom surface of the via hole is etched and removed by using a gas such as $SF_6$ as a gas system and applying a high bias to the stage side, on which the substrate is placed, to cause anisotropic ions to enter the substrate. At this time, ions hardly enter the inner side surface of the via hole. Thus, the protection film on the inner side surface of the via hole is not removed, and the inner side surface of a via hole is protected from etching by the protection film in the isotropic etching step of the next cycle, and etching proceeds only on the inner bottom surface of the via hole. Repetition of this cycle allows etching to gradually proceed vertically in the depth direction of the semiconductor substrate SUB.

A problem of the Bosch process is occurrence of a concave-convex shape that is a so-called scallop on the inner side surface of the through hole 60, as illustrated in FIG. 2B. Thus, the inner side surface of the through hole 60 has such a shape that a convex portion and a concave portion are repeated in an alternating manner in the depth direction of the through hole 60. When the insulating member 40 is formed on this concave-convex surface, there is a problem of a crack (break) occurring inside the insulating member 40 starting from a convex portion of the scallop due to thermal expansion and contraction of the semiconductor substrate SUB during a process.

If the insulating member 40 were formed of a single film, a crack would be formed inside the insulating member 40 continuously from the bottom surface on the semiconductor substrate SUB side to the top surface of the through electrode 50 side. A crack occurring in such a way may cause a significant reduction in the dielectric voltage between the through electrode 50 and the semiconductor substrate SUB. It may be possible to reduce occurrence of a crack by reducing the time of the isotropic etching step in the above-described Bosch process to reduce the unevenness of the scallop. In this case, however, there is a problem of a reduction in productivity due to a slow etching rate.

In the semiconductor device according to the present embodiment, as illustrated in FIG. 2B, the first insulating film 41 and the second insulating film 42 are formed in this order from the semiconductor substrate SUB side to the through electrode 50 side. The second insulating film 42 is thicker than the first insulating film 41. A concave-convex shape may occur in the first insulating film 41 due to the unevenness in the inner side surface of the through hole 60. A concave portion P2 in the first insulating film 41 on the second insulating film 42 side is formed in a different height with respect to a convex portion P1 in the inner side surface of the through hole 60 in the depth direction of the through hole 60 by forming the first insulating film 41 by chemical vapor deposition (CVD), for example. That is, the position of the convex portion P1 in the inner side surface of the through hole 60 and the position of the concave portion P2 in the first insulating film 41 are different from each other in the depth direction of the through hole 60. The second insulating film 42 is formed according to the form of the first insulating film 41 as illustrated in FIG. 2B. The first insulating film 41 has concave portions corresponding to concave portions on the inner side surface of the through hole 60 on the second insulating film 42 side. The second insulating film 42 has concave portions corresponding to convex portions on the inner side surface of the through hole 60 on the first insulating film 41 side. By forming the first insulating film 41 and the second insulating film 42 by a CVD method, in particular, a plasma CVD method, the concave-convex shape as illustrated in FIG. 2B can be ensured to occur in the first insulating film 41 and the second insulating film 42.

How a crack occurs inside the first insulating film 41 and the second insulating film 42 formed as described above will now be described. When a crack occurs inside the first insulating film 41 due to the difference in the thermal expansion coefficient between the semiconductor substrate SUB and the first insulating film 41, the crack occurs at a position C1 of FIG. 2B starting from the convex portion P1 of the scallop of the through hole 60. When a crack occurs inside the second insulating film 42 due to the difference in the thermal expansion coefficient between the first insulating film 41 and the second insulating film 42, the crack occurs at a position C2 of FIG. 2B starting from the concave portion P2 of the first insulating film 41. Note that, in the following, a crack occurring at the position C1 is referred to as "crack C1" and a crack occurring at the position C2 is referred to as "crack C2".

Since the convex portion P1 in the inner side surface of the through hole 60 and the concave portion P2 of the first insulating film 41 are formed at different heights from each other as described above, cracks occurring inside the first insulating film 41 and the second insulating film starting from the convex portion P1 and the concave portion P2, respectively, also occur at different heights from each other. That is, the position of the crack C1 inside the first insulating film 41 and the position of the crack C2 inside the second insulating film 42 are different from each other in the depth direction of the through hole 60. The crack C1 is located between the convex portion in the inner side surface of the through hole 60 and the concave portion of the second insulating film 42 on the first insulating film 41 side corresponding to the convex portion in the inner side surface of the through hole 60. The crack C2 is located between the through electrode 50 and the concave portion of the first insulating film 41 on the second insulating film 42 side corresponding to the concave portion in the inner side surface of the through hole 60.

That is, in the present embodiment, as illustrated in FIG. 2B, the crack C1 occurring inside the first insulating film 41 and the crack C2 occurring inside the second insulating film 42 are disconnected and discontinuous. In such a way, in the present embodiment, a crack of the insulating member 40 is in the first insulating film 41, and the crack in the first insulating film 41 is located between the inner side surface of the through hole 60, which is the side surface connecting the first surface to the second surface of the semiconductor substrate SUB, and the second insulating film 42. Therefore, according to the present embodiment, it is possible to suppress a crack formed continuously inside the first insulating film 41 and the second insulating film 42 from the surface of the first insulating film 41 on the semiconductor substrate SUB side to the surface of the second insulating film 42 on the through electrode 50 side. Therefore, according to the present embodiment, the high insulation characteristics between the through electrode 50 and the semiconductor substrate SUB can be maintained.

Next, a manufacturing method of the semiconductor device according to the present embodiment will be described by using FIG. 3A to FIG. 4C. FIG. 3A to FIG. 3F are process sectional views illustrating the manufacturing method of the semiconductor device according to the present embodiment of the present invention. FIG. 4A to FIG. 4C are enlarged schematic sectional views of the inner side surface of a through hole and the peripheral thereof in the manufacturing method of the semiconductor device according to the present embodiment. Note that a known semiconductor manufacturing process may be used for manufacturing of the semiconductor device. Further, heat treatment, a cleaning process, or the like may be performed between respective steps, if necessary, while the description thereof will be omitted.

Figure 3A:
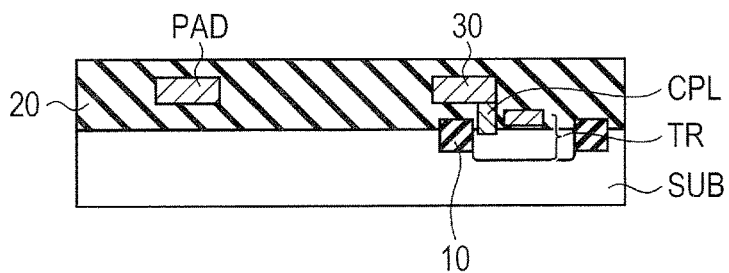
FIGS. 3A, 3B, 3C, 3D, 3E and 3F are process sectional views illustrating a manufacturing method of the semiconductor device according to the first embodiment of the present invention.
Figure 4A:
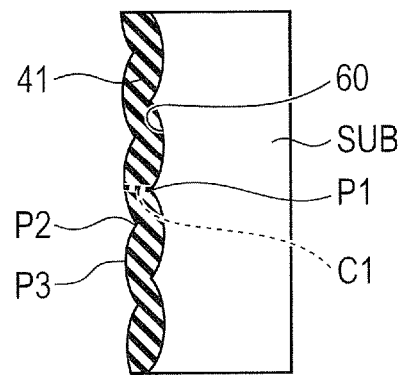
FIGS. 4A, 4B and 4C are enlarged schematic sectional views of the inner side surface of a through hole and the peripheral thereof in the manufacturing method of the semiconductor device according to the first embodiment of the present invention.
Figure 4B:
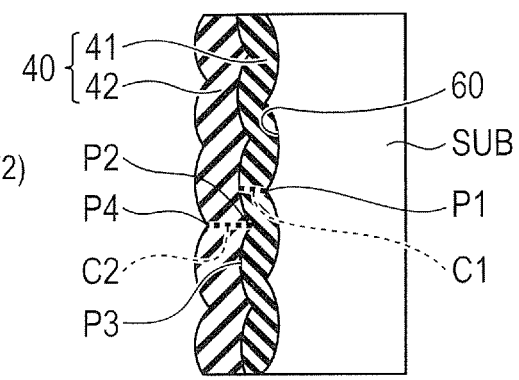
Figure 4C:
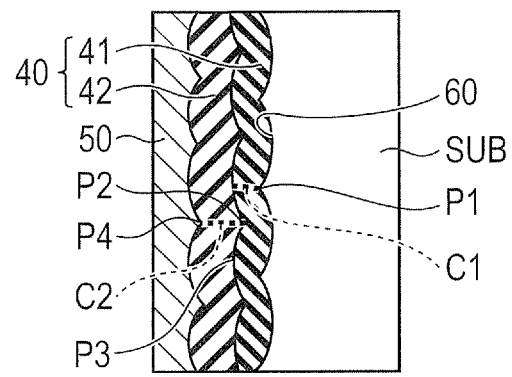

First, in the step of FIG. 3A, the semiconductor substrate SUB is prepared, and the semiconductor element TR such as a MOS transistor is formed on the first surface side (the front surface side) of the semiconductor substrate SUB. The element isolation portion 10 formed of an element isolation film is formed in the semiconductor substrate SUB by Shallow Trench Isolation (STI) or the like. Each semiconductor element TR may be formed in an element region defined by the element isolation portion 10 and electrically isolated from neighboring semiconductor element TR by the element isolation potion 10.

The interlayer insulating layer 20 and various conductive members arranged therein such as the wiring layer 30 and the electrode portion PAD, the contact plug CPL used for electrically connecting the wiring layer 30 and the semiconductor element TR to each other, or the like are formed on the first surface of the semiconductor substrate SUB in which the semiconductor element TR is formed. An insulating film made of a silicon oxide, a silicon nitride, a silicon oxide nitride, or the like, for example, may be used for the interlayer insulating layer 20.

The interlayer insulating layer 20 and respective conductive materials can be formed as follows. That is, first, a Boron Phosphorous Silicon Glass (BPSG) film is formed as the interlayer insulating layer 20 by a sub-atmospheric CVD method, for example. The contact plug CPL in which a conductive material such as tungsten is embedded is formed inside the interlayer insulating layer 20 for connecting the semiconductor element TR and the wiring layer 30 to each other. The wiring layer 30 and the electrode portion PAD are formed, for example, by depositing a conductive material such as Al using a sputtering method and patterning the conductive material using dry etching. The wiring layer 30 and the electrode portion PAD are electrically connected to each other and, while preferably formed in the same layer for a shorter process, may be formed in different layers and connected by a via. Note that the wiring layer 30 and the electrode portion PAD may also be formed by using a conductive material such as Cu by a Damascene process or the like. In such a way, the wiring layer 30 and the electrode portion PAD are formed on the first surface side of the semiconductor substrate SUB via the interlayer insulating layer 20. An interlayer insulating layer is further formed on the upper layer of the wiring layer 30 and the electrode portion PAD using a silicon oxide film by a plasma CVD method, for example, and the interlayer insulating layer 20 are formed together. Thus, the semiconductor substrate provided with the semiconductor element TR, and the wiring layer 30 and the electrode portion PAD is prepared.

Subsequently, although not shown, in a case such as where wafer level implementation, which is one of the package techniques, is performed, the semiconductor substrate SUB may be thinned if necessary. When the semiconductor substrate SUB is thinned, a support substrate is attached on the first surface side of the semiconductor substrate SUB, and a back grind process is performed from the second surface side of the semiconductor substrate SUB to thin the semiconductor substrate SUB. More specifically, a quartz glass (not shown) with a thickness of 0.5 mm, for example, as a support substrate is attached to the first surface side of the semiconductor substrate SUB by an adhesive (not shown), and the semiconductor substrate SUB is then thinned to a thickness of 0.2 mm, for example, by a back grind process.

Figure 3B:
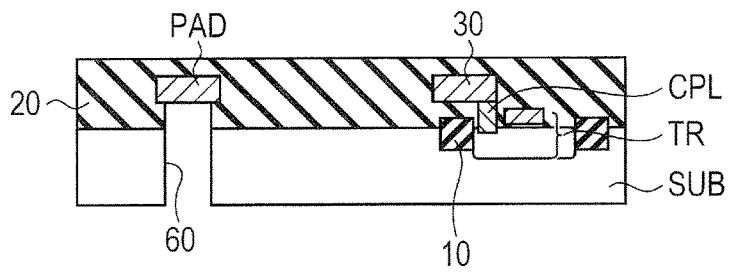

Next, in the step of FIG. 3B, first, a pattern of a photoresist (not illustrated) is formed on the second surface side (the back surface side) of the semiconductor substrate SUB. Next, dry etching is performed from the second surface side of the semiconductor substrate SUB to form the through hole 60.

In a region of the semiconductor substrate SUB in which the through hole 60 is to be formed, the above-described Bosch process is used to vertically etch the semiconductor substrate SUB until the interlayer insulating layer 20 is exposed. After the etching of the semiconductor substrate SUB, the interlayer insulating layer 20 is etched by anisotropic etching using dry etching, for example, and the through hole 60 is formed and extended to reach the electrode portion PAD. In the dry etching for etching the interlayer insulating layer 20 in an anisotropic manner, capacitor coupling Reactive Ion Etching (RIE) or the like based on a $CF_4$, $C_4F_8$, $O_2$, or Ar mixture gas can be used, for example. In such a way, the semiconductor substrate SUB and the interlayer insulating layer 20 are opened in this order from the second surface side of the semiconductor substrate SUB, and the through hole 60 that reaches the electrode portion PAD is formed in the semiconductor substrate SUB and the interlayer insulating layer 20.

Figure 3C:
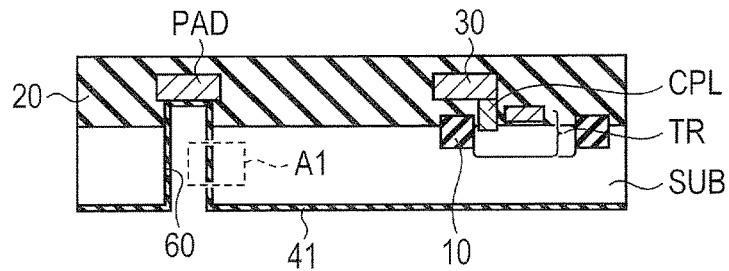

Next, in the step of FIG. 3C, the first insulating film 41 is formed on the entire surface of the second surface of the semiconductor substrate SUB including the inner side surface and the inner bottom surface (the exposed surface of the electrode portion PAD) of the through hole 60. As the first insulating film 41, an insulating film made of an insulating material such as a silicon oxide, a silicon nitride, a silicon oxide nitride, or the like can be used. More specifically, as the first insulating film 41, an insulating film made of a silicon oxide with a thickness of, for example, 0.5 μm on the second surface of the semiconductor substrate SUB is formed by a plasma CVD method at a deposition temperature of 200 degrees Celsius, for example.

Figure 3D:
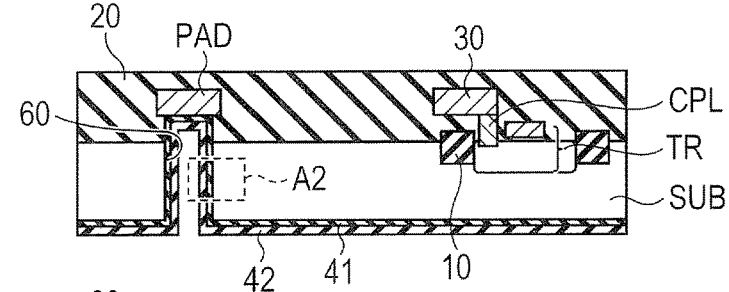

Next, in the step of FIG. 3D, the second insulating film 42 is formed after the deposition of the first insulating film 41. As the second insulating film 42, in a similar manner to the first insulating film 41, an insulating film made of an insulating material such as a silicon oxide, a silicon nitride, a silicon oxide nitride, or the like can be used. More specifically, as the second insulating film 42, an insulating film made of a silicon oxide with a thickness of, for example, 1 μm on the second surface of the semiconductor substrate SUB is formed by a plasma CVD method at a deposition temperature of 160 degrees Celsius, for example. The manufacturing method of the semiconductor device according to the present embodiment is characterized in that the deposition temperature T2 of the second insulating film 42 is lower than the deposition temperature T1 of the first insulating film 41. The detailed feature regarding the deposition temperature will be described later.

In such a way, the first insulating film 41 and the second insulating film 42 are formed stacked in this order on the inner surface including the inner side surface and the inner bottom surface of the through hole 60.

Figure 3E:
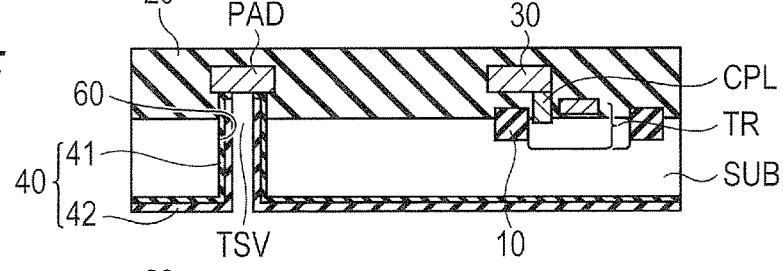

Next, in the step of FIG. 3E, the second insulating film 42 and the first insulating film 41 are removed in this order by dry etching such that only the inner bottom surface (the exposed surface of the electrode portion PAD) of the through hole 60 is opened by an etching-back method, for example. In the dry etching of the second insulating film 42 and the first insulating film 41, capacitor coupling RIE or the like based on a $CF_4$, $C_4F_8$, $O_2$, or Ar mixture gas can be used, for example.

Note that, although the first insulating film 41 and the second insulating film 42 are formed after the through hole 60 is formed so as to expose the electrode portion PAD in the present embodiment, the embodiment is not limited thereto. It is possible to expose the electrode portion PAD on the bottom of the through hole 60 after forming the first insulating film 41 and the second insulating film 42 in a manner described below. That is, when the through hole 60 is formed, the semiconductor substrate SUB is opened such that the through hole 60 penetrates the semiconductor substrate SUB, and etching of the interlayer insulating layer 20 is then stopped with the interlayer insulating layer 20 being partially left. That is, without the electrode portion PAD being exposed on the bottom of the through hole 60, the etching of the interlayer insulating layer 20 is stopped. Next, the first insulting film 41 and the second insulating film 42 are formed stacked in this order on the entire second surface of the semiconductor substrate SUB including the inner side surface and the inner bottom surface of the through hole 60. The interlayer insulating layer 20 together with the first insulating film 41 and the second insulating film 42 on the bottom of the through hole 60 are then collectively removed by etching-back. Thereby, the interlayer insulating layer is opened such that the through hole 60 reaches the electrode portion PAD, and the electrode portion PAD is exposed on the bottom of the through hole 60.

Figure 3F:
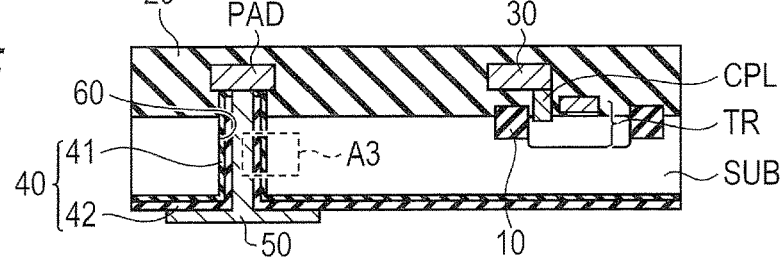

Next, in the step of FIG. 3F, a metal such as copper, aluminum, or the like, for example, is embedded inside the through hole 60 as a conductive material forming the through electrode 50. Thereby, the through electrode 50 made of a metal embedded inside the through hole 60 is formed. The metal forming the through electrode 50 can be embedded by, for example, forming a metal seed layer (not shown) made of copper on the inner side surface and the inner bottom surface of the through hole 60 by a sputtering method and then causing crystal growth of the copper by an electrodeposition method. Note that a barrier metal formed of titanium, tantalum, a nitride thereof, or the like may be formed between the second insulating film 42 and the through electrode 50 so as to prevent the embedded metal from diffusing in the semiconductor substrate SUB.

Although not shown, a step of applying a solder resist, a step of placing a solder ball, a step of dicing, or the like is then performed by a known semiconductor manufacturing process, and manufacturing of semiconductor devices is completed.

Occurrence of a crack in the insulating film formed on the inner side surface of the through hole 60 in each step of the manufacturing method of the semiconductor device of the present embodiment will now be described in detail by using FIG. 4A to FIG. 4C.

First, FIG. 4A is a schematic sectional view illustrating the through hole 60 immediately after the first insulating film 41 is formed at the deposition temperature T1 so as to cover the inner side surface of the through hole 60 of the semiconductor substrate SUB. FIG. 4A illustrates the region A1 surrounded by a dashed line in FIG. 3C. As illustrated in FIG. 4A, a crack C1 occurs from the convex portion P1 of the scallop so as to traverse the inside of the first insulating film 41. The first insulating film 41 is formed by a CVD method and, as a result of growth of a film along the shape of the scallop, the concave portion P2 occurs at approximately the middle height of the neighboring convex portion P1 of the first insulating film 41. That is, the convex portion P1 of the scallop and the concave portion P2 of the surface of the first insulating film 41 are formed in the different position from each other in the depth direction of the through hole 60. The unevenness of the surface of the first insulating film 41 is a feature resulted from the deposition by a CVD method, and a convex portion P3 has a relatively smooth round shape while the concave portion P2 has a sharp recessed shape as illustrated in FIG. 4A. Note that, in the present embodiment, the deposition temperature T1 for the first insulating film 41 may be 200 degrees Celsius as described above. The deposition temperature T1 for the first insulating film 41 is set higher than the deposition temperature T2 for the second insulating film 42.

Next, FIG. 4B is a schematic sectional view illustrating the through hole 60 immediately after the second insulating film 42 is formed at the deposition temperature T2 after the deposition of the first insulating film 41. FIG. 4B illustrates the region A2 surrounded by a dashed line in FIG. 3D. As illustrated in FIG. 4B, in the second insulating film 42, the positional relationship of the concave portion and the convex portion in the depth direction of the through hole 60 follows the concave portion and the convex portion of the first insulating film 41 and causes no displacement. Since the concave portion P2 of the first insulating film 41 has a sharp recessed shape as described above, however, the crack C2 occurs so as to traverse the inside of the second insulating film 42 from the concave portion P2 of the first insulating film 41 to a concave portion P4 of the second insulating film 42. Note that, in the present embodiment, the deposition temperature T2 for the second insulating film 42 may be 160 degrees Celsius as described above. The deposition temperature T2 for the second insulating film 42 is set lower than the deposition temperature T1 for the first insulating film 41.

In general, a crack occurring in an insulating film is caused by a difference in the thermal expansion coefficient between a semiconductor substrate and the insulating film due to heating and cooling during a process. As discussed in the present embodiment, with a process having a relationship of T1>T2, the thermal deformation amount of the semiconductor substrate SUB is smaller when the second insulating film 42 is deposited than when the first insulating film 41 is deposited. When the first insulating film 41 having a larger thermal deformation amount is deposited, occurrence of a crack inside the first insulating film 41 results in a relaxed residual stress inside the first insulating film 41. The second insulating film 42 is then deposited, and the thermal deformation amount is smaller when the second insulating film 42 is deposited than when the first insulating film 41 is deposited. This suppresses occurrence of a new crack in the first insulating film 41 starting from a convex portion of the scallop of the through hole 60 when the second insulating film 42 is deposited. As a result, it is possible to suppress or further prevent occurrence of a crack formed inside the first insulating film 41 and the second insulating film 42 continuously from the surface of the first insulating film 41 on the semiconductor substrate SUB side to the surface of the second insulating film 42 on the through electrode 50 side. The crack occurring inside the second insulating film 42 is discontinuous from the crack occurring inside the first insulating film 41.

FIG. 4C is a schematic sectional view illustrating the through hole 60 after the through electrode 50 is formed. FIG. 4C illustrates a region A3 surrounded by the dashed line in FIG. 3F. With the manufacturing method of the semiconductor device according to the present embodiment, it is possible to form the through electrode 50 while suppressing or preventing occurrence of a crack formed inside the insulating member 40 continuously from the bottom surface to the top surface of the insulating member 40, as illustrated in FIG. 4C. That is, it is possible to form the through electrode 50 while suppressing or preventing occurrence of a crack formed inside the first insulating film 41 and the second insulating film 42 continuously from the surface of the first insulating film 41 on the semiconductor substrate SUB side to the surface of the second insulating film 42 on the through electrode 50 side. Thereby, the insulation characteristics between the through electrode 50 and the semiconductor substrate SUB and/or the performance of preventing diffusion of the conductive member of the through electrode 50 into the semiconductor substrate SUB can be maintained. As a result, a high yield rate of the semiconductor device can be maintained and a high reliability can be maintained in the long term.

As discussed above, according to the present embodiment, occurrence of a crack formed inside the insulating member 40 continuously from the bottom surface to the top surface of the insulating member 40 is suppressed. Therefore, according to the present embodiment, a reliable semiconductor device with a high yield rate in which the insulation characteristics of the insulating member 40 between the through electrode 50 and the semiconductor substrate SUB is maintained in the long term can be obtained.

Second Embodiment

A semiconductor device and a manufacturing method thereof according to a second embodiment of the present invention will be described by using FIG. 5A to FIG. 5D. FIG. 5A to FIG. 5D are enlarged schematic sectional views of the inner side surface of a through hole and the peripheral thereof in the manufacturing method of the semiconductor device according to the present embodiment. Note that the same components as those in the semiconductor device and the manufacturing method thereof according to the above-described first embodiment are labeled with the same reference numeral or symbol, and the description thereof will be omitted or simplified.

The structure of the semiconductor device according to the present embodiment is the same as the structure of the semiconductor device according to the first embodiment.

The difference of the present embodiment from the first embodiment is that a heat treatment step of heating the semiconductor substrate SUB is performed between the step of forming the first insulating film 41 and the step of forming the second insulating film 42 in the manufacturing method of the semiconductor device. In other words, in the present embodiment, the step of stacking the first insulating film 41 and the second insulating film 42 in this order includes the step of heating the semiconductor substrate SUB after forming the first insulating film 41 and before forming the second insulating film 42. Therefore, in the manufacturing method of the semiconductor device according to the present embodiment, the same steps as those described in the first embodiment can be used for steps on and before the step of forming the first insulating film 41 and steps on and after the step of forming the second insulating film 42. The heat treatment of heating the semiconductor substrate SUB is for heating the first insulating film 41 before the second insulating film 42. Further, the heat treatment may be performed by a deposition apparatus such as a CVD apparatus used for deposition of the first insulating film 41 or the second insulating film 42, or may be performed by using various annealing apparatus such as a lamp anneal apparatus, for example.

Occurrence of a crack in the insulating film formed on the inner side surface of the through hole 60 in each step including heat treatment of the manufacturing method of the semiconductor device of the present embodiment will be described in detail by using FIG. 5A to FIG. 5D. In the present embodiment, a heat treatment temperature Ta in the step of heating the semiconductor substrate SUB is set higher than the deposition temperature T1 for the first insulating film 41 and the deposition temperature T2 for the second insulating film 42, as described below.

Figure 5A:
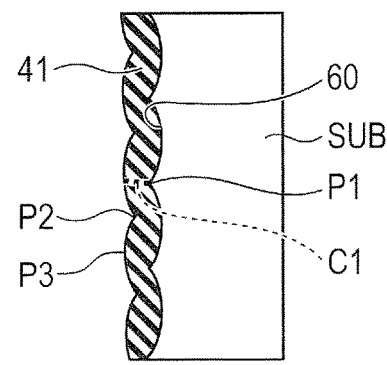
FIGS. 5A, 5B, 5C and 5D are enlarged schematic sectional views of the inner side surface of a through hole and the peripheral thereof in the manufacturing method of the semiconductor device according to a second embodiment of the present invention.

First, FIG. 5A is a schematic sectional view illustrating the through hole 60 immediately after the first insulating film 41 is formed at the deposition temperature T1 so as to cover the inner side surface of the through hole 60 of the semiconductor substrate SUB. As illustrated in FIG. 5A, the crack C1 occurs from the convex portion P1 of the scallop so as to traverse the inside of the first insulating film 41, and the concave portion P2 occurs in the surface of the first insulating film 41 in the same manner as the first embodiment. In the present embodiment, the deposition temperature T1 for the first insulating film 41 can be 160 degrees Celsius.

Figure 5B:
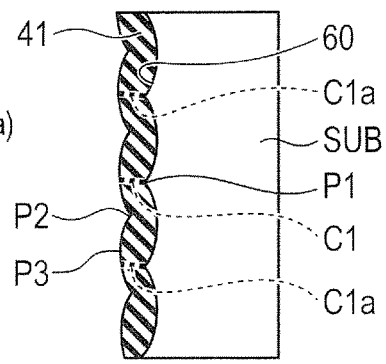

Next, FIG. 5B is a schematic sectional view illustrating the through hole 60 immediately after the first insulating film 41 is heated by performing heat treatment at the heat treatment temperature Ta after the first insulating film 41 is formed and before the second insulating film 42 is formed. In the present embodiment, the heat treatment temperature Ta can be 200 degrees Celsius. By performing a process with a relation of Ta>T1 in such a way, it is possible to intentionally induce a new crack C1a inside the first insulating film 41. This can provide advantages of reduction in the number of potential cracks occurring in the first insulating film 41 and relaxation in the internal stress of the first insulating film 41.

Note that it is preferable that the heating rate of the semiconductor substrate SUB when the semiconductor substrate SUB is heated be set greater than the heating rates of the semiconductor substrate SUB when the first insulating film 41 is deposited and the second insulating film 42 described later is deposited. Since a greater substrate-heating rate at which the semiconductor substrate SUB is heated results in sudden heat deformation of the semiconductor substrate SUB, this enhances the advantage of inducing a crack in the first insulating film 41 to relax a stress remaining inside the first insulating film 41.

Figure 5C:
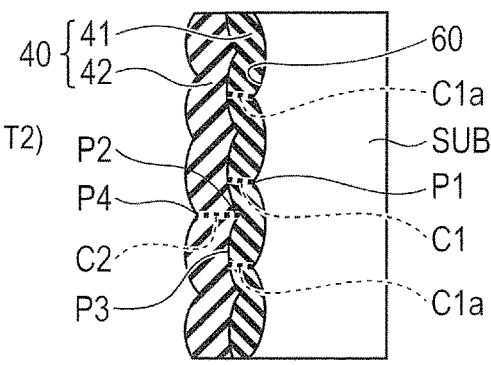

FIG. 5C is a schematic sectional view illustrating the through hole 60 immediately after the second insulating film 42 is formed on the first insulating film 41 at the deposition temperature T2. As illustrated in FIG. 5C, the crack C2 occurs from the concave portion P2 of the first insulating film 41 so as to traverse the inside of the second insulating film 42 toward a concave portion P4 of the second insulating film 42, in the same manner as the first embodiment. In the present embodiment, the deposition temperature T2 for the second insulating film 42 can be 160 degrees Celsius that is the same as the deposition temperature T1 for the first insulating film 41. Even when the deposition temperature T1 for the first insulating film and the deposition temperature T2 for the second insulating film 42 are the same, the deposition temperature T2 for the second insulating film 42 is set lower than the heat treatment temperature Ta after the formation of the first insulating film 41 in the present embodiment. By performing the process with the relationship of Ta>T2, it is possible to suppress a crack newly occurring from the first insulating film 41 starting from the convex portion P1 of the scallop of the through hole 60, because the thermal deformation amount is smaller at the formation of the second insulating film 42 than at the heat treatment. As a result, it is possible to suppress or further prevent occurrence of a crack formed inside the first insulating film 41 and the second insulating film 42 continuously from the surface of the first insulating film 41 on the semiconductor substrate SUB side to the surface of the second insulating film 42 on the through electrode 50 side. The crack occurring inside the second insulating film 42 is discontinuous from the crack occurring inside the first insulating film 41.

Further, as discussed in the present embodiment, by adding heat treatment in a separate manner between the step of forming the first insulating film 41 and the step of forming the second insulating film 42, it is possible to set the deposition temperature T1 for the first insulating film and the deposition temperature T2 for the second insulating film 42 to the same temperature. By setting the deposition temperatures to the same as each other in such a way, the first insulating film 41 and the second insulating film 42 can be formed in the same film quality as each other. That is, the thermal expansion coefficient of the first insulating film 41 and the thermal expansion coefficient of the second insulating film 42 can be the same as each other. It is therefore possible to suppress a peeling and a crack occurring due to the difference in the thermal expansion coefficient between the first insulating film 41 and the second insulating film 42.

Note that, also in the present embodiment, with respect to the deposition temperature T1 for the first insulating film 41 and the deposition temperature T2 for the second insulating film 42, the deposition temperature T1 can be set higher than the deposition temperature T2 in a similar manner to the first embodiment. That is, in the present embodiment that performs heat treatment, with respect to the deposition temperature T1 for the first insulating film 41 and the deposition temperature T2 for the second insulating film 42, the deposition temperature T1 can be set higher than or equal to the deposition temperature T2.

Figure 5D:
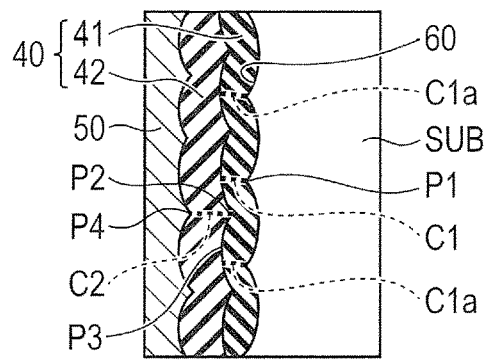

FIG. 5D is a schematic sectional view illustrating the through hole 60 after the through electrode 50 is formed. Also with the manufacturing method of the semiconductor device according to the present embodiment, it is possible to form the through electrode 50 while suppressing or preventing occurrence of a crack formed inside the insulating member 40 continuously from the bottom surface to the top surface of the insulating member 40, as illustrated in FIG. 5D. That is, it is possible to form the through electrode 50 while suppressing or preventing occurrence of a crack formed inside the first insulating film 41 and the second insulating film 42 continuously from the surface of the first insulating film 41 on the semiconductor substrate SUB side to the surface of the second insulating film 42 on the through electrode 50 side. This allows for maintaining the insulation characteristics between the through electrode 50 and the semiconductor substrate SUB and/or the performance of preventing diffusion of the conductive member of the through electrode 50 into the semiconductor substrate SUB. As a result, a high yield rate of the semiconductor device can be maintained and a high reliability can be maintained in the long term.

As discussed above, according to the present embodiment, occurrence of a crack formed inside the insulating member 40 continuously from the bottom surface to the top surface of the insulating member 40 is suppressed. Therefore, according to the present embodiment, a reliable semiconductor device with a high yield rate in which the insulation characteristics of the insulating member 40 between the through electrode 50 and the semiconductor substrate SUB is maintained in the long term can be obtained.

Note that, also in the present embodiment, the electrode portion PAD can be exposed on the bottom of the through hole 60 after the first insulating film 41 and the second insulating film 42 are formed as described in the first embodiment.

Modified Embodiments

The present invention is not limited to the above-described embodiments, but various modifications are possible.

For example, although the case where two layers of the first insulating film 41 and the second insulating film 42 are formed as insulating films of the insulating member 40 has been described as an example in the above embodiments, the embodiment is not limited thereto. Multilayered insulating films with not only two layers but also three or more layers may be formed as the insulating films of the insulating member 40. Further, multilayered insulating films may be formed of the same insulating material as each other or may be formed of different insulating materials from each other.

Further, although a case where the through hole 60 is formed by using the Bosch process has been described as an example in the above embodiments, the embodiment is not limited thereto. An etching process other than the Bosch process or other fabrication processes can be used for formation of the through hole 60. A fabrication process other than the Bosch process may provide the same advantages as described above as long as the process causes an unevenness to occur in the inner side surface of the through hole 60.

Although some preferred examples of the present invention have been illustrated above, the present invention is not limited to these examples and a part of the example may be modified or adjusted within a scope not departing from the spirit of the present invention.

Further, each of the terms in the present specification have been used only for the purpose of illustrating of the present invention and may include the equivalent thereof, and the present invention is not limited to the strict sense of these terms.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-231339, filed Nov. 29, 2016, which is hereby incorporated by reference herein in its entirety.

What is claimed is:

1. A semiconductor device comprising:
    a semiconductor substrate having a first surface and a second surface that oppose each other, the semiconductor substrate being provided with a through hole, which is surrounded by an inner side surface connecting the first surface to the second surface, the inner side surface having a shape in which a convex portion and a concave portion are repeated in an alternating manner in a depth direction of the through hole;
    a semiconductor element arranged on a first surface side of the semiconductor substrate;
    a wiring layer arranged on the first surface side of the semiconductor substrate;
    a through electrode arranged in the through hole of the semiconductor substrate, penetrating the semiconductor substrate, and connected to the wiring layer; and
    an insulating member arranged between the inner side surface and the through electrode,
    wherein the insulating member includes a first insulating film arranged between the inner side surface and the through electrode, and includes a second insulating film arranged between the first insulating film and the through electrode, and
    wherein a crack in the insulating member is in the first insulating film, and the crack is located between the second insulating film and the inner side surface.

2. The semiconductor device according to claim 1, wherein the second insulating film has, on a first insulating film side, a concave portion corresponding to the convex portion of the inner side surface.

3. The semiconductor device according to claim 2, wherein the crack is located between the convex portion of the inner side surface and the concave portion of the second insulating film.

4. The semiconductor device according to claim 3, wherein the first insulating film has, on a second insulating film side, a concave portion corresponding to the concave portion of the inner side surface.

5. The semiconductor device according to claim 4, wherein another crack in the insulating member is in the second insulating film, and the another crack is located between the through electrode and the concave portion of the first insulating film.

6. The semiconductor device according to claim 5, wherein a thickness of the second insulating film is greater than a thickness of the first insulating film.

7. The semiconductor device according to claim 4, wherein a position of the convex portion of the inner side surface and a position of the concave portion of the first insulating film on the second insulating film side are different from each other in the depth direction of the through hole.

8. The semiconductor device according to claim 7, wherein another crack in the insulating member is in the second insulating film, a position of the crack in the first insulating film and a position of the another crack in the second insulating film are different from each other in the depth direction of the through hole.

9. The semiconductor device according to claim 8, wherein each of the first insulating film and the second insulating film comprises any one of a silicon oxide, a silicon nitride, and a silicon oxide nitride.

10. The semiconductor device according to claim 6, further comprising a support substrate provided on the first surface side of the semiconductor substrate.

11. The semiconductor device according to claim 10, wherein the semiconductor device is a solid state imaging device.

12. The semiconductor device according to claim 1, wherein the semiconductor device is manufactured by a method comprising steps of:
  preparing the semiconductor substrate, the semiconductor substrate being provided with the semiconductor element on the first surface side of the semiconductor substrate, and with a wiring layer on the first surface side of the semiconductor substrate via an interlayer insulating layer;
  forming the through hole reaching the wiring layer and the interlayer insulating layer by opening the semiconductor substrate and the interlayer insulating layer from the second surface of the semiconductor substrate;
  stacking the first insulating film and the second insulating film in this order on the inner side surface; and
  after the stacking of the first insulating film and the second insulating film, forming the through electrode comprising a conductive material by embedding the conductive material inside the through hole,
  wherein a deposition temperature for the first insulating film is higher than a deposition temperature for the second insulating film.

13. The semiconductor device according to claim 1, wherein the semiconductor device is manufactured by a method comprising steps of:
  preparing the semiconductor substrate, the semiconductor substrate being provided with the semiconductor element on the first surface side of the semiconductor substrate, and with a wiring layer on the first surface side of the semiconductor substrate via an interlayer insulating layer;
  forming the through hole reaching the wiring layer and the interlayer insulating layer by opening the semiconductor substrate and the interlayer insulating layer from the second surface of the semiconductor substrate;
  stacking the first insulating film and the second insulating film in this order on the inner side surface; and
  after the stacking of the first insulating film and the second insulating film, forming the through electrode comprising a conductive material by embedding the conductive material inside the through hole,
  wherein the step of stacking the first insulating film and the second insulating film in this order includes a step of heating the semiconductor substrate after forming the first insulating film and before forming the second insulating film.

14. The semiconductor device according to claim 13, wherein a temperature of a heat treatment in the step of heating the semiconductor substrate is higher than deposition temperatures for the first insulating film and the second insulating film.

15. The semiconductor device according to claim 13, wherein a heating rate in the step of heating the semiconductor substrate is greater than heating rates when depositing the first insulating film and the second insulating film.

16. The semiconductor device according to claim 12, wherein the step of forming the through hole includes steps of:
  opening the semiconductor substrate such that the through hole penetrates the semiconductor substrate; and
  after the step of forming the first insulating film and the second insulating film, opening the interlayer insulating layer such that the through hole penetrating the semiconductor substrate reaches the wiring layer.

17. The semiconductor device according to claim 13, wherein the step of forming the through hole includes steps of:
  opening the semiconductor substrate such that the through hole penetrates the semiconductor substrate; and
  after the step of forming the first insulating film and the second insulating film, opening the interlayer insulating layer such that the through hole penetrating the semiconductor substrate reaches the wiring layer.

18. The semiconductor device according to claim 12, wherein the step of forming the first insulating film and the second insulating film forms the first insulating film and the second insulating film by a CVD method, respectively.

19. The semiconductor device according to claim 18, wherein the CVD method is a plasma CVD method.

* * * * *